United States Patent [19]

Anttila

[11] Patent Number: 4,600,256

[45] Date of Patent: Jul. 15, 1986

[54] CONDENSED PROFILE ELECTRICAL CONNECTOR

[75] Inventor: Dennis A. Anttila, Tamarac, Fla.

[73] Assignee: Motorola, Inc., Schaumburg, Ill.

[21] Appl. No.: 688,111

[22] Filed: Dec. 31, 1984

[51] Int. Cl.$^4$ .................. H03H 7/00; H01R 13/46; H01G 9/00

[52] U.S. Cl. .................. 339/17 M; 333/185; 339/147 R; 339/143 R; 361/433

[58] Field of Search .............. 333/185, 12; 339/14 R, 339/17 LC, 17 LM, 17 M, 147 R, 143 R; 361/400, 403, 433 C

[56] References Cited

U.S. PATENT DOCUMENTS

| | | | |
|---|---|---|---|
| 3,129,990 | 4/1964 | Rice et al. ................. | 339/17 LM |
| 3,287,686 | 11/1966 | Ruehlemann ............... | 339/17 LM |
| 3,643,201 | 2/1972 | Harwood .................... | 339/14 R |
| 3,764,955 | 10/1973 | Ward ......................... | 339/176 MP |
| 3,902,776 | 9/1975 | Williams et al. ........... | 339/17 C |
| 4,384,757 | 5/1983 | Andrews, Jr. et al. ...... | 339/17 M |
| 4,401,355 | 8/1983 | Young ........................ | 339/147 R |

FOREIGN PATENT DOCUMENTS

| | | | |
|---|---|---|---|
| 1054515 | 4/1959 | Fed. Rep. of Germany ........ | 339/17 LM |
| 2208104 | 8/1973 | Fed. Rep. of Germany ........ | 339/17 LM |

OTHER PUBLICATIONS

Technical Wire Products, Inc., advertisement, 05-1974.
"Protection of Printed-Circuit Cards", IBM Technical Disclosure Bulletin, by Hammer and Syler, vol. 19, No. 5.
Advertisement by AVX Corporation-Electronic Engineering Times, Mar. 26, 1984.

Primary Examiner—Gil Weidenfeld
Assistant Examiner—Gary F. Paumen
Attorney, Agent, or Firm—Steven G. Parmelee

[57] ABSTRACT

A condensed profile electrical connector to be used in electrically coupling a flexible conductor connector plug to a primary printed circuit board. The electrical connector includes a support unit (11) having a secondary printed circuit board (17) and a connector housing (18), a first plurality of conductors (12) for electrical connection to the flexible conductors, a second plurality of conductors (13) for connecting the first plurality of conductors (12) to the primary printed circuit board, a third conductor (14) comprising a conductive material disposed over a substantial portion of one side of the secondary printed circuit board (17) for providing a ground plane, and a plurality of capacitors (16) for capacitively coupling each of the first conductors (12) to the third conductor (14) for providing EMI filtering. The electrical connector may be connected to the primary printed circuit board in a minimum of profile area (32) and, once connected, provides beneficial EMI filtering and RF filtering.

6 Claims, 5 Drawing Figures

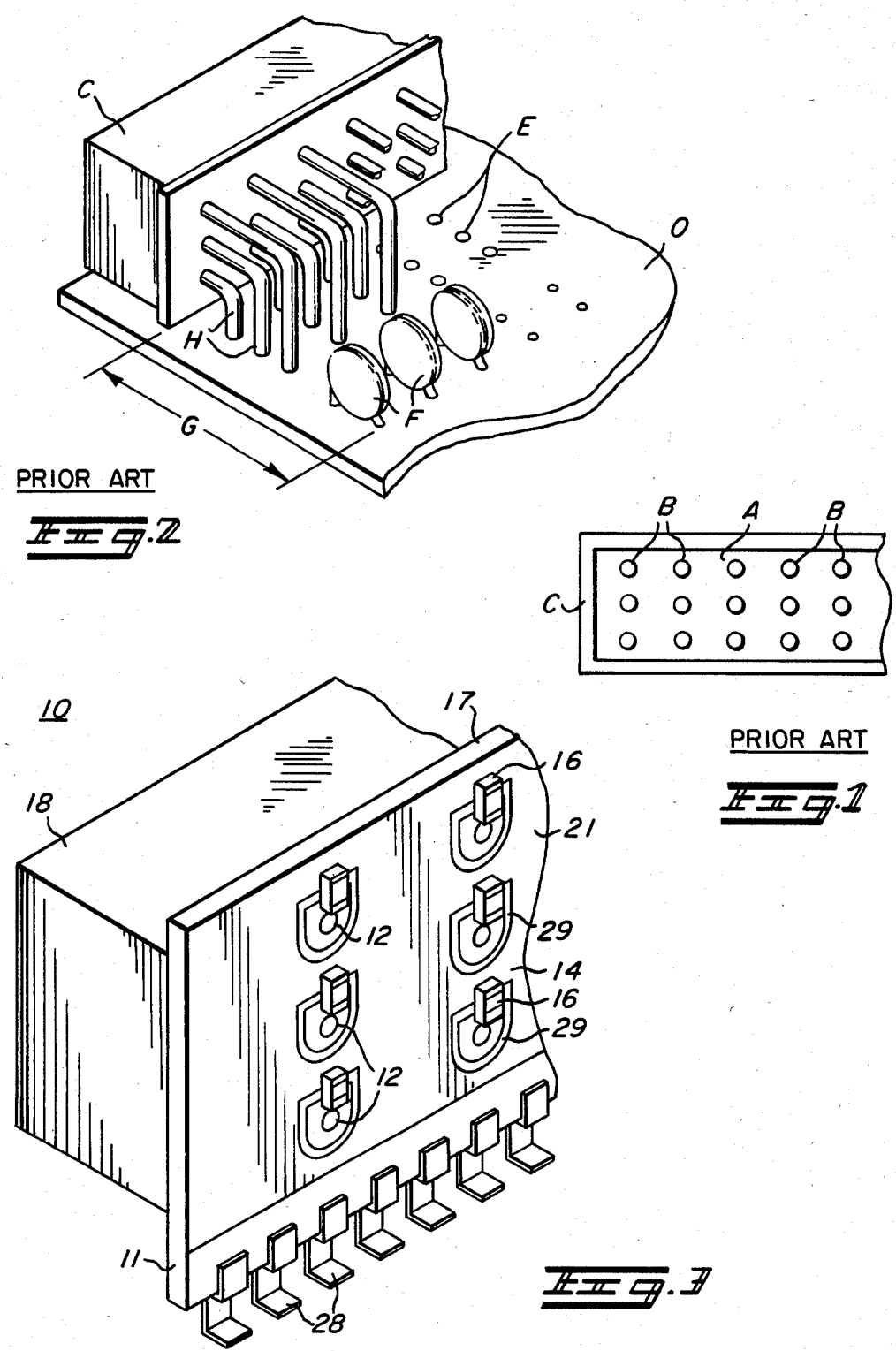

CONDENSED PROFILE ELECTRICAL CONNECTOR

TECHNICAL FIELD

This invention relates generally to electrical connectors, and particularly to such connectors as may be used to connect multiple-conductor cables to printed circuit boards.

BACKGROUND ART

It often becomes necessary in the design and manufacture of electrically controlled systems to connect one electrical component in one part of the system to one or more other components in other parts of the system. When the distance between these components exceeds some practical threshold, flexible conductors will typically be utilized to electrically bridge the components. Often such flexible conductors will be comprised of multiple-conductor cables.

Sometimes, such connections are effectuated through use to nonpermanent connectors to simplify installation and to ensure simple disassembly as desired. For example, one prior art connector has a plug comprised of a plastic block having a matrix of 60 holes formed therein, these holes being arranged in a matrix of 20 rows by 3 columns. Each hole connects electrically to a separate conductor, such that up to 60 conductors in a multiple-conductor cable can be connected through use of this one connector plug.

To accomodate such a connector plug, a connector receiver can be provided having a cavity for receiving the connector plug (as depicted by the letter A in FIG. 1) and 60 conductor pins (B) for operable interaction with the holes in the connector plug. The connector receiver can then be electrically connected to one or more electrical components, and the connector plug selectively connected and disconnected by installing or removing the connector plug from interaction with the connector receiver.

With reference to FIG. 2, a typical installation of such a connector receiver (C) with respect to a primary printed circuit board (O) will be described. The primary printed circuit board (O) will typically have a number of holes (E) formed therethrough for receiving conductor leads (H) that attach to the connector pins (B). These holes (E) are arranged in a matrix that duplicates the pin arrangement on the connector (C) itself. In the particular example illustrated, this results in 20 columns and 3 rows.

In addition, in order to afford some degree of filtering, a plurality of capacitors (F) will also be positioned on the printed circuit board (O) and electrically coupled to the conductor leads as appropriate to ensure filtering.

The profile dimension noted by reference character G provides an indication of the amount of primary printed circuit board space required to effectuate such a connection. For some applications, this space requirement presents no problems. There are situations, however, when this extensive use of printed circuit board space presents an unacceptable design limitation. For instance, when the primary printed circuit board (O) comprises a ceramic substrate, material and processing costs make such an orientation highly unfavorable. Furthermore, when dealing with a ceramic substrate, the provision of so many holes (E) to accomodate both the conductor leads (H) and the capacitors (F) raises additional cost and quality concerns.

In addition, prior art connectors generally provide little or no RF shielding as between the primary printed circuit board and the flexible conductors.

There therefore exists a need for an electrical connector that can facilitate the attachment of a plurality of flexible conductors to a primary printed circuit board within the confines of a minimized profile, thereby saving printed circuit board space. Furthermore, such an electrical connector should minimize the number of holes that need to be provided in the primary printed circuit board material itself, and further, radio frequency shielding should be provided to protect the flexible conductors.

SUMMARY OF INVENTION

These needs and others are met through provision of the condensed profile electrical connector as disclosed in this specification. This connector includes a support unit for connection between a flexible conductor and a printed circuit board, a first plurality of conductors for electrically connecting to the flexible conductors, a second plurality of conductors for electrically connecting the first plurality of conductors to the primary printed circuit board, a third conductor for providing radio frequency shielding with respect to the flexible conductors, and a plurality of capacitors for capacitively connecting the first plurality of conductors to the third conductor to provide EMI filtering.

In a more specified embodiment, the support unit includes a printed circuit board having holes disposed therethrough to match the pinout configuration of the flexible conductor connector plug. For instance, when using a connector plug having a pinout configuration of 20 columns and 3 rows, a similarly configured matrix of holes will be provided on the support unit printed circuit board. The support unit further includes a housing operably affixed to the support unit printed circuit board and being appropriately configured to mate with the flexible conductor connector plug.

The first plurality of conductors can be comprised of electrically conductive pins; one such pin being disposed in each hole provided in said support unit printed circuit board. These pins are disposed within the support unit housing and serve to electrically mate with the flexible conductor connector plug when the connector plug has been disposed within the support unit housing.

The second plurality of conductors are comprised of conductor paths that are formed on one side of the support unit printed circuit board. These printed circuit paths form a conductive path to one edge of the support unit printed circuit board and are electrically coupled to a plurality of clips. These clips are mechanically and electrically coupled to the printed circuit board, with each such clip being connected to only one printed circuit path.

Each clip has one leg that may be bent as appropriate to facilitate connection of the support unit printed circuit board to the primary printed circuit board. All of the clips are disposed substantially colinear with respect to one another, thereby avoiding the necessity of a matching pin out matrix when connecting the support unit printed circuit board to the primary circuit board.

The third conductor comprises a ground plane that includes a conductive surface formed over one side of the support unit printed circuit board. This conductive surface does not directly contact either the first or second plurality of conductors, except where such connections are necessary to effectuate a ground coupling.

Finally, a plurality of chip capacitors are electrically connected between the first plurality of conductors and the third conductor to capacitively couple the first conductors to the third conductor and thereby obtain EMI filtering benefits.

So configured, the support unit can be physically and electrically connected to the primary printed circuit board by soldering the above mentioned clips to the surface of the primary circuit board. This affixment requires no holes in the primary printed circuit board, though holes could be accommodated if that were desired. Since the clips are aligned colinear and not in a matrix format, the connection utilizes little primary circuit board space. Furthermore, the placement of the capacitors on the support unit printed circuit board further reduces space requirements on the primary circuit board and further contributes to condensing the profile. Finally, the presence of the capacitors on the support unit printed circuit board and the existence of the ground plane assures more efficient EMI filtering and beneficial RF shielding, thereby exceeding the electrical performance of prior art connectors.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein:

FIG. 1 comprises a partial front elevational view of a prior art connector;

FIG. 2 comprises a partial perspective view of a prior art connector and printed circuit board assembly;

FIG. 3 comprises an enlarged partial rear perspective view of the connector in accordance with the invention;

BEST MODE FOR CARRYING OUT THE INVENTION

Figure 4:
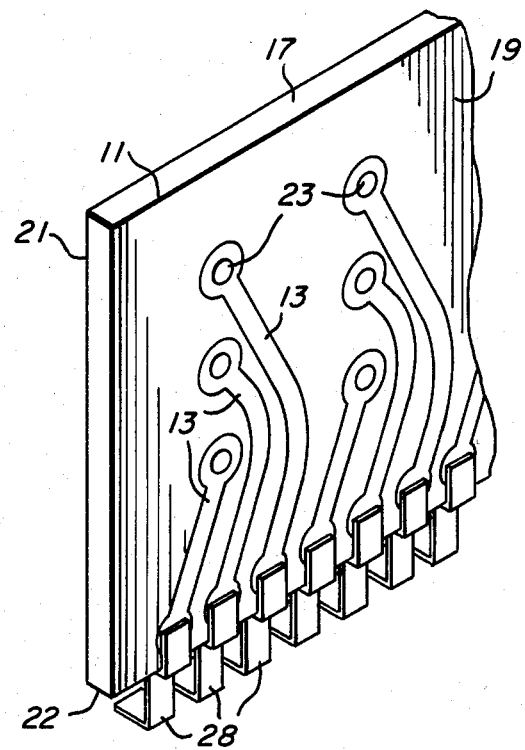
FIG. 4 comprises a partial front perspective view of the support unit printed circuit board.
Figure 5:
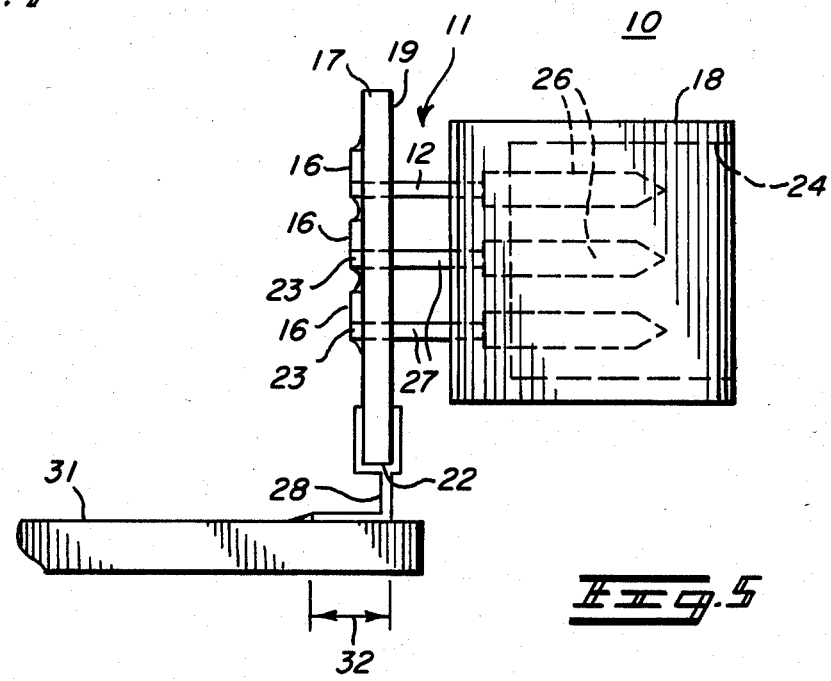
FIG. 5 comprises a partial side elevational view of the connector as connected to a primary printed circuit board.

Referring now specifically to the drawings, the device may be seen as depicted generally in FIGS. 3 and 5 and as denoted generally by the numeral 10. The device (10) includes generally a support unit (11), a first plurality of conductors (12), a second plurality of conductors (13) (FIG. 4), a third conductor (14) (FIG. 3), and a plurality of capacitors (16). Each of these generally described components will now be described in more detail in seriatim fashion.

With continued reference to FIGS. 3 and 5, the support unit (11) includes generally a printed circuit board (17) and a connector housing (18). The printed circuit board (17) has a first side (19), a second side (21), and a first edge (22). In addition, the printed circuit board (17) has a plurality of holes (23) disposed therethrough for receiving electrical conductors as described in more detail below.

The housing (18) essentially comprises a prior art housing having a cavity (24) formed therein such that a flexible conductor connector plug may be snuggly disposed therein.

The first plurality of conductors (12) include electrically conductive pins (26) that are disposed within the cavity (24) of the housing unit (18) for interaction with the holes formed in the flexible conductor connector plug. These pins (26) are arranged in a configuration to match the hole pattern of the connector plug to ensure appropriate connection and fit. Each pin (26) connects to a conductive lead (27), and each such conductor lead (27) fits through a hole (23) as provided in the support unit printed circuit board (17). These conductor leads (27) may then be soldered in place to affix the various components in place and assure their electrical integrity.

The second plurality of conductors may be seen with reference to FIG. 4, and are comprised of printed circuit paths. Each conductor path connects to one of the first plurality of conductor pins and also to a conducting clip (28). With reference to FIGS. 3, 4 and 5, these clips each have a U-shaped channel such that the first edge (22) of the support unit printed circuit board (17) can be gripped therebetween and an L-shaped leg extending therefrom. These clips (28) are aligned substantially colinear with respect to one another and are substantially uniformly shaped. These clips (28) may be held in place both by physically gripping the support unit printed circuit board (17) and by being soldered thereto. If these clips (28) are intended instead for through-hole mounting, then clips (28) having different shapes could be utilized in accordance with well known principals.

With reference to FIG. 3, the third conductor (14) comprises a layer of conducting material disposed over a substantial portion of the second side (21) of the support unit printed circuit board (17). A gap (29) has been provided about each of the first conductor holes so that the first plurality of conductors are not directly coupled to the third conductor (14), except, of course, where a direct connection is desired to effectuate a ground coupling. In addition, the third conductor (14) does not extend as far as the first edge (22) of the support unit printed circuit board (17) to avoid electrically coupling the clips (28) to one another.

Finally, the capacitors (16) may be comprised of chip capacitors that are electrically connected between each of the first plurality of conductors (12) and the third conductor (14). These capacitors (16) provide EMI filtering.

With reference to FIG. 5, the device (10) can be connected to a primary printed circuit board (31) by simply soldering the clips (28) to appropriate conductor pads as disposed on the surface of the primary printed circuit board (31). No holes need be drilled or otherwise formed through the primary printed circuit board material. Furthermore, the profile area (32) necessitated by use of the device (10) to facilitate connection is much less than the space required by prior art connectors. In addition, the third conductor (14) provides a ground plane that effectively shields the flexible conductors from much unwanted RF interference.

Therefore, through use of this device, space requirements on the primary circuit board (31) will be minimized, EMI filtering will be optimized, and RF shielding will be obtained to gain a benefit not previously provided by prior art devices.

There will of course be many modifications and alterations that those skilled in the art will recognize as regards the construction and use of this device. These modifications and alterations are not to be considered as outside the scope of the claims unless specifically limited with respect thereto.

I claim:

1. A condensed profile electrical connector for use in electrically coupling a plurality of conductors to a primary circuit board, said electrical connector comprising:
   (a) support means comprising a secondary circuit board for structurally connecting to said plurality of conductors and to said primary circuit board;
   (b) first conductor means for electrically connecting to at least some of said plurality of conductors;
   (c) second conductor means for electrically connecting at least some of said first conductor means to said primary circuit board;
   (d) third conductor means for providing radio frequency shielding with respect to said connector, said third conductor means not being directly electrically coupled with at least some of either of said first and second conductor means, said third conductor means comprising a conductor disposed over a substantial portion of at least one side of said secondary printed circuit board; and
   (e) capacitive means for connection between at least some of said first conductor means and said third conductor means.

2. The electrical connector of claim 1 wherein said secondary printed circuit board is positioned in a substantially perpendicular orientation with respect to said primary printed circuit board.

3. The electrical connector of claim 1 wherein said second conductor means includes a plurality of clips that electrically connect to said primary printed circuit board and said secondary printed circuit board, said clips having a leg formed thereon substantially perpendicular to said secondary printed circuit board for allowing said clips to be physically and electrically coupled to said primary printed circuit board on a surface thereof.

4. The electrical connector of claim 1 wherein said first conductor means includes a plurality of conductors that extend through said seocndary printed circuit board.

5. The electrical connector of claim 4 wherein said capacitive means includes a plurality of capacitors, with each one of said capacitors connecting between said third conductor means and one of said first conductor means.

6. The electrical connector of claim 1 wherein said second conductor means comprises a plurality of printed circuit conductor paths formed on said secondary printed circuit board.

* * * * *